United States Patent
Fu et al.

(10) Patent No.: US 8,193,867 B2
(45) Date of Patent: Jun. 5, 2012

(54) VOLTAGE CONTROLLED OSCILLATOR WITH DITHER

(75) Inventors: Zhuo Fu, San Diego, CA (US); Susumu Hara, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 27 days.

(21) Appl. No.: 12/916,194

(22) Filed: Oct. 29, 2010

(65) Prior Publication Data

US 2012/0105160 A1    May 3, 2012

(51) Int. Cl.
*H03L 7/08* (2006.01)
*H03M 3/02* (2006.01)

(52) U.S. Cl. ............... 331/34; 327/156; 341/143

(58) Field of Classification Search ........ 331/16, 331/25, 34, 1 A; 327/156; 341/155, 156, 341/131, 142, 143; 332/117, 127, 128

See application file for complete search history.

(56) References Cited

U.S. PATENT DOCUMENTS

| | | | | |
|---|---|---|---|---|
| 5,834,987 A | * | 11/1998 | Dent | .......... 332/127 |
| 7,288,998 B2 | | 10/2007 | Thomsen et al. | |
| 7,295,077 B2 | | 11/2007 | Thomsen et al. | |
| 7,417,510 B2 | | 8/2008 | Huang | |

* cited by examiner

*Primary Examiner* — Ryan Johnson
(74) *Attorney, Agent, or Firm* — Zagorin O'Brien Graham LLP

(57) ABSTRACT

A voltage control signal at a voltage control signal input terminal is used to adjust an output frequency of an oscillator circuit. The voltage level of the voltage control signal is converted in a one-bit analog-to-digital converter (ADC) to a digital output indicative of the voltage level. Successive digital representations of the voltage level of the voltage control signal are upsampled to generate upsampled blocks of data. A dither circuit inserts a digital dither in the upsampled blocks of data to generate dithered upsampled data, which is used to generate a control signal for a feedback divider of a phase-locked loop circuit and thereby adjust the output frequency.

20 Claims, 6 Drawing Sheets

US 8,193,867 B2

VOLTAGE CONTROLLED OSCILLATOR WITH DITHER

BACKGROUND

1. Field of the Invention

The invention relates to reducing spurs in an oscillator having an output frequency that can be varied from an external control signal.

2. Description of the Related Art

Voltage controlled crystal oscillators (VCXOs) provide the ability to vary a frequency of the output according to a voltage control input signal. Providing similar functionality to a VCXO with lower cost components, increased flexibility in frequency range, and/or increased functionality is desirable given the wide range of products requiring clocks with varying levels of accuracy.

SUMMARY

In an embodiment a method of operating a voltage controlled oscillator is provided that includes receiving a voltage control signal at a voltage control signal input terminal. The voltage level of the voltage control signal is converted in a one-bit analog-to-digital converter (ADC) to a digital output indicative of the voltage level. Successive digital representations of the voltage level of the voltage control signal are upsampled to generate upsampled blocks of data. The successive digital representations of the voltage level correspond direct to the digital output or indirectly, e.g., through a low pass filter. A dither circuit inserts a digital dither in the upsampled blocks of data to generate dithered upsampled data, which is used to generate a divide ratio for a feedback divider of a phase-locked loop circuit.

In another embodiment an apparatus is provided that includes a voltage control signal input terminal to receive a voltage control signal to adjust an output signal of an oscillator. An analog-to-digital converter (ADC) is coupled to the voltage control signal input terminal and generates digital signals indicative of the voltage level. An upsampling circuit is coupled to the ADC and upsamples digital representations of the voltage control signal to form upsampled blocks of data, each block corresponding to a digital representation of the voltage control signal. A dithering circuit inserts a digital dither in the upsampled blocks of data to generate dithered upsampled blocks of data, which are used to control a divide ratio of a feedback divider of a phase-locked loop.

DESCRIPTION OF THE DRAWINGS

The present invention may be better understood, and its numerous objects, features, and advantages made apparent to those skilled in the art by referencing the accompanying drawings.

Note that the use of the same reference symbols in different drawings indicates similar or identical items.

DESCRIPTION OF THE PREFERRED EMBODIMENT(S)

Figure 1:
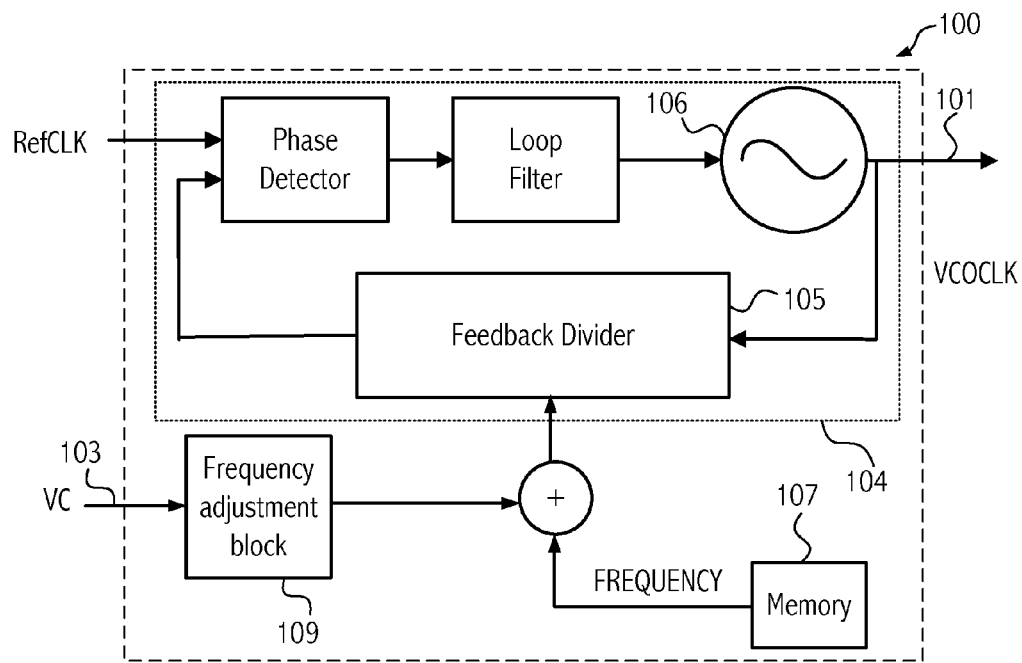
FIG. 1 illustrates a high level block diagram of an oscillator circuit that incorporates an embodiment of the invention.

Referring to FIG. 1, illustrated is a high level block diagram of an oscillator circuit 100 having an output 101 that can be adjusted by a voltage control signal 103. The oscillator circuit includes a phase-locked loop 104 that has a feedback divider 105 and a VCO 106. One way to adjust the output frequency of the oscillator circuit 100 is to adjust the divide ratio of the feedback divider 105. In the illustrated embodiment the feedback divider 105 has a divide ratio determined by a value (which corresponds to a particular desired frequency) stored in memory 107 and the voltage control signal 103. The voltage control signal 103 is processed in the frequency adjustment block 109 to generate an appropriate adjustment signal to be combined with the frequency signal from memory 107. In other embodiments the divide ratio may be provided by frequency adjustment block 109 without needing to be combined with a base frequency signal. In an embodiment the oscillator circuit is formed on an integrated circuit and the voltage control signal 103 is supplied on an input terminal of the integrated circuit.

Figure 2:
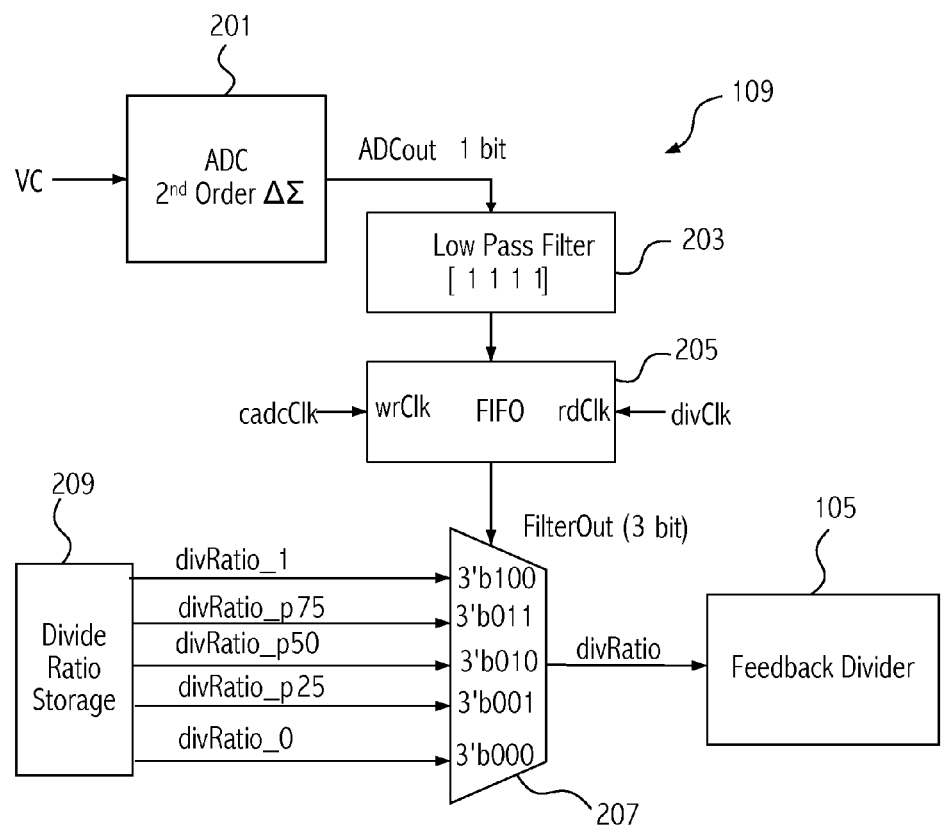
FIG. 2 illustrates a high level block diagram illustrating an embodiment for generation of the divide ratio based on the control voltage input.

In order to provide a simple and low power solution to translate the voltage control signal 103 to a digital value that may be utilized to control the feedback divide ratio, and thus the output frequency of the oscillator circuit 100, an embodiment of the invention utilizes a single-bit analog-to-digital converter (ADC). Referring to FIG. 2, an embodiment of the invention includes ADC 201. In the illustrated embodiment the ADC 201 is a second order delta sigma modulator that supplies a one-bit output signal. The ones density of the ADC output corresponds to the voltage level of the voltage control signal. The output of the ADC 201 supplies a low pass filter 203. The low pass filter 203 is implemented in the illustrated embodiment as a simple four tap [1111] low pass filter that provides filter outputs that have a value of zero to four. The filter output represents the number of ones in the last four ADC output bits. The simple low pass filter lowers noise and spurs. Other embodiments may utilize other size filters or omit the filter entirely. Omission of the low pass filter results in higher bandwidth for the ADC.

The output of the low pass filter is supplied to a first in first out (FIFO) buffer 205. In the illustrated embodiment, the write clock of the FIFO is the same clock as that used by the ADC 201. In the illustrated embodiment, the read clock of the FIFO is the clock used by the feedback divider. The FIFO 205 addresses the differences in clock phase and/or frequency between clock domains of the ADC and the feedback divider. Other embodiments may not require use of the FIFO, where, e.g., the phase and frequency are the same.

The filter output is coupled to a control input of selector circuit 207 and selects an adjustment value to adjust the divide ratio of the feedback divider to thereby adjust the output 101 of the PLL. In the illustrated embodiment selector circuit 207 selects between five divide ratio values. The feedback divide ratios allow adjustment of the oscillator output for voltage control (VC) values corresponding to VC=0, VC=25%, VC=50% (mid-scale), VC=75% and VC=100% of its full scale value. The five selectable values correspond to the filter output values of zero to four. In other embodiments there may be more selectable divide ratios (or fewer) depending on the size and output of the low pass filter. The divide ratios are determined based on such factors as the appropriate value for the divide ratio for feedback divider 105 at the VC signal's mid-scale value and the parts per million (ppm) tuning range. The divide ratios specify the ppm/volt gain associated with the VC voltage.

In an embodiment the VC full scale value is VDD, which is the supply voltage supplied to the oscillator 100. Note that the divide ratios may be stored in memory 209 and may be programmed through, e.g., a serial interface (not shown). In other embodiments, rather than providing a divide ratio directly, an adjustment to an existing divide ratio of the feedback divider is provided. If used as an adjustment to a divide ratio, the adjustment value is combined with a base divide ratio that selects a desired center frequency from, e.g., memory 107 (see FIG. 1). In an embodiment the VC signal causes no adjustment to the center frequency at the VC signal midscale value and the output frequency of the oscillator circuit frequency is adjusted linearly up or down on either side of the midscale VC voltage value. Other embodiments may choose different approaches (e.g., non linear) to utilize the VC signal. Once the appropriate divide ratio is selected by the selector circuit 107, it is supplied to the feedback divider circuit 105 to control the divide ratio of the feedback divide ratio.

Figure 3:
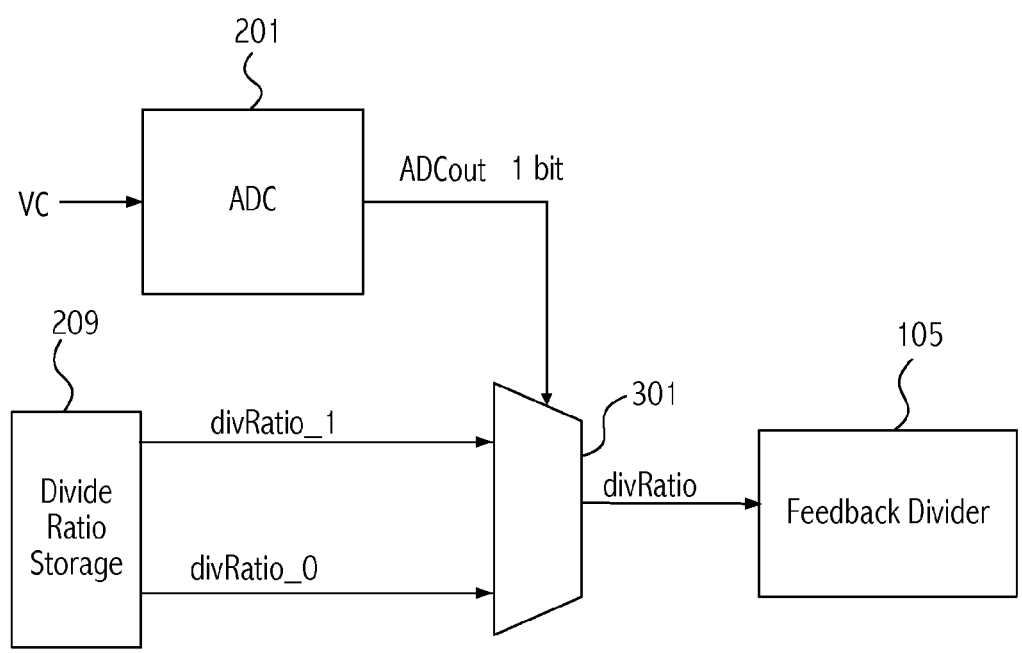
FIG. 3 illustrates a high level block diagram illustrating another embodiment for generation of the divide ratio based on the control voltage input.

Referring to FIG. 3, an embodiment includes an ADC 201 that supplies a single bit digital output stream having a ones density corresponding to the value of the control voltage. That stream controls multiplexer 301 to select between a divide ratio corresponding to 100% of fullscale and 0%. The embodiment in FIG. 3 may be utilized in circumstances where the phase noise requirements are not as stringent as those in which the low pass filter (FIG. 2) is utilized.

Figure 4:
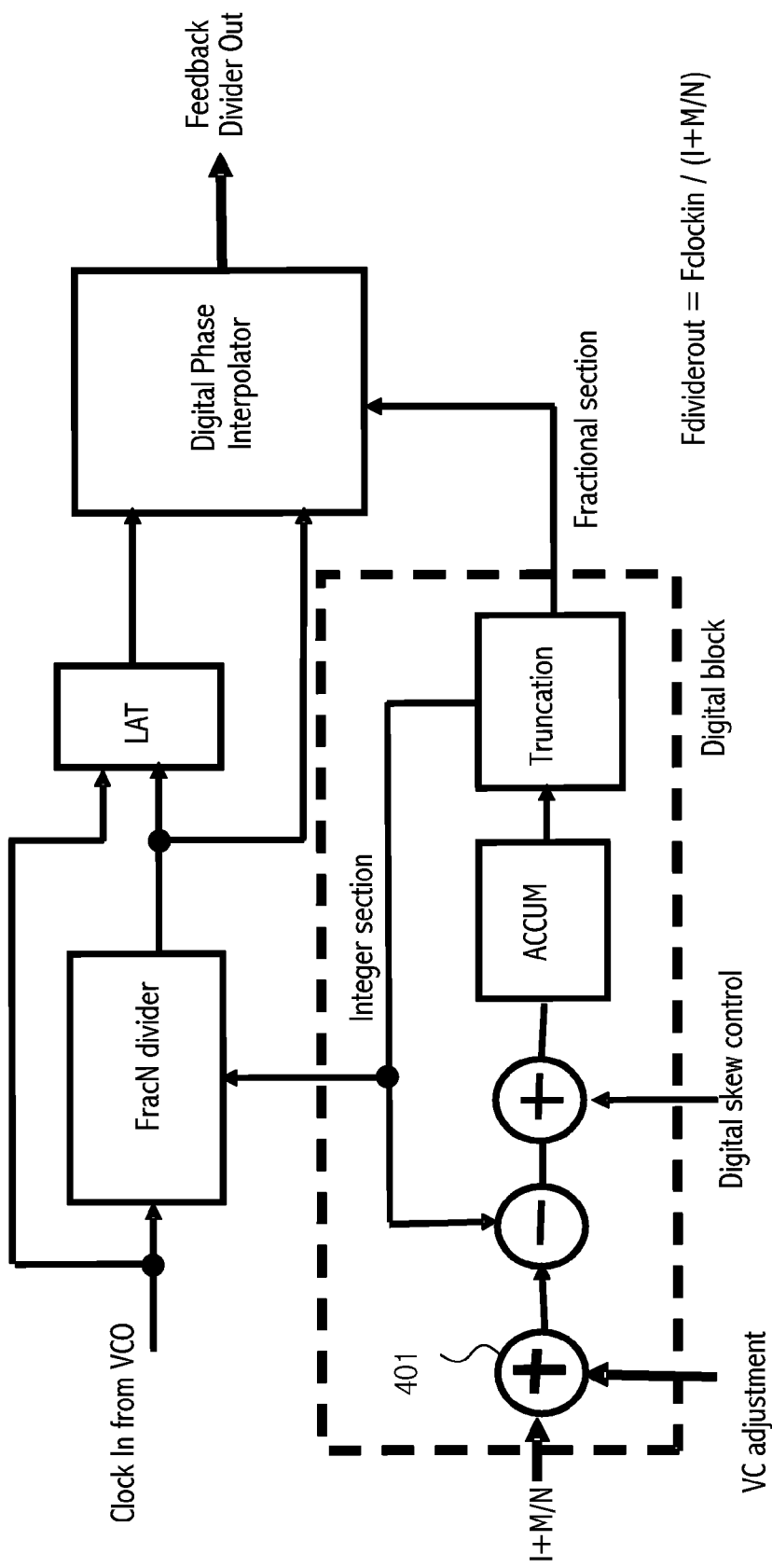
FIG. 4 illustrates a high level diagram of an interpolative divider used as a feedback divider according to an embodiment of the invention.

In an embodiment the PLL 104 includes a multi-modulus feedback divider as feedback divider 105. In another embodiment the feedback divider is an interpolative divider. An exemplary interpolative divider is shown in FIG. 4. The divide ratio is specified as an integer and fractional portion (I+M/N). In an embodiment the divide ratio value supplied from multiplexer 207 or 301 based on the voltage at the VC terminal is an adjustment to the divide ratio that is provided to the summing block 401 to be summed with another divide ratio value. In other embodiments the multiplexer 207 or 307 selects the divide ratio (I+M/N) corresponding to the VC value and the summer 401 can be eliminated. Additional details on the operation of the interpolative divider can be found in U.S. Pat. No. 7,417,510, entitled "Direct Digital Interpolative Synthesis," issued Aug. 26, 2008, which patent is incorporated herein by reference.

The quantization noise of ADC 201 is mostly filtered out by the PLL loop. The full scale of the VC tuning range is continuously programmable, in other words, kv (ppm/volt) is continuously programmable by programming the appropriate divide ratios, within the limits of the PLL.

In one embodiment dithering is introduced to reduce spurs associated with the delta sigma modulator in the ADC. One way to introduce dithering is through analog dithering. However, analog dithering can introduce instability, and to effectively reduce spurs, the noise level added by analog dithering can be large. Accordingly, in an embodiment, digital dithering is introduced to effectively reduce spurs without adding significant phase noise. The dithering embodiment described herein is simple and power efficient.

Figure 5:
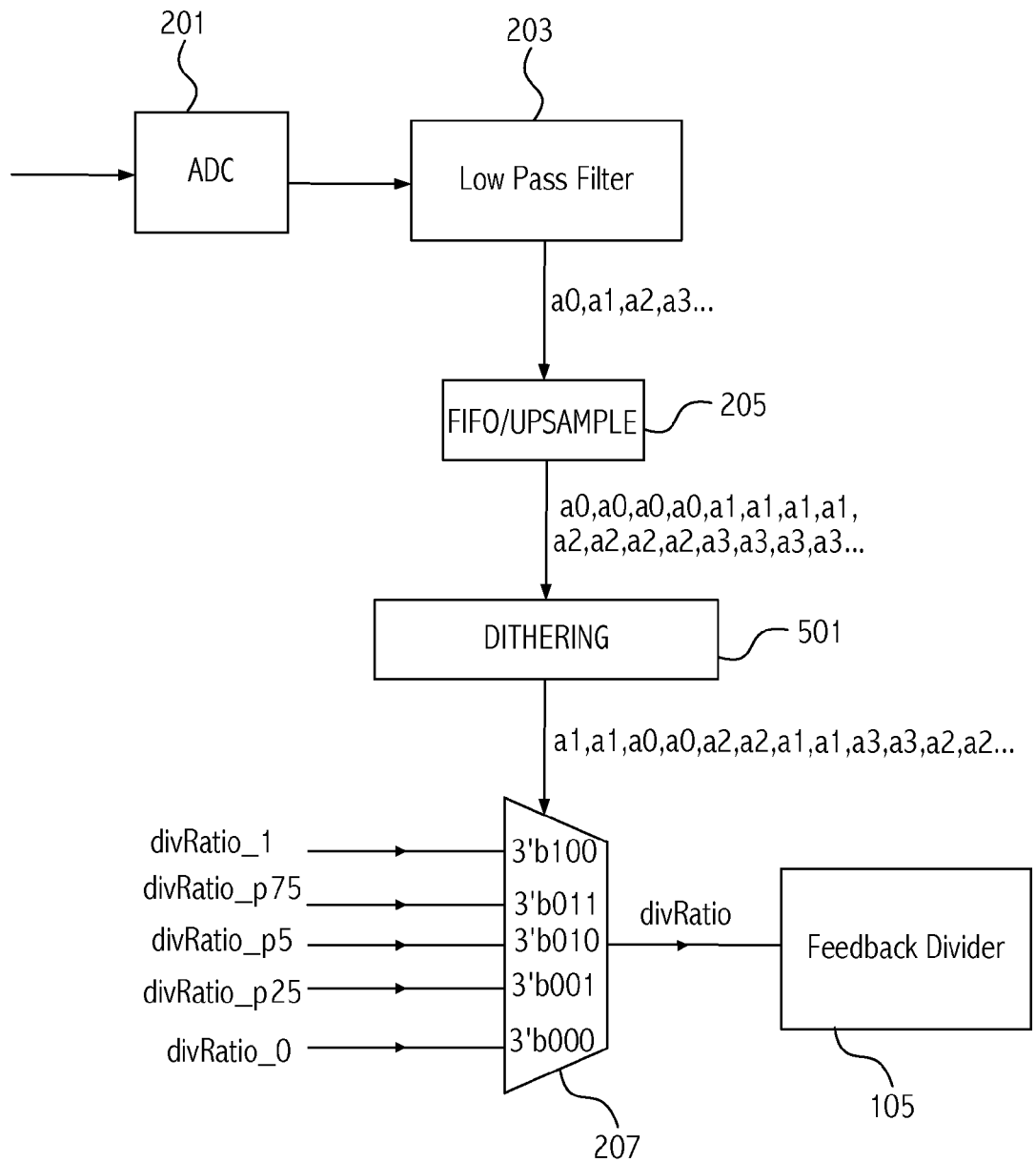
FIG. 5 illustrates a high level diagram of an embodiment of the invention that generates the divide ratio using digital dithering.

Referring to FIG. 5, a high level block diagram of an embodiment incorporating digital dithering is illustrated. The output stream of the low pass filter 203 is shown as outputs a0, a1, a2, a3, where a0 is the earliest output of the filter and a3 is the latest filter output. Each filter output represents a number from zero to four to correspond to the number of ones present in the last four outputs of the ADC. The ADC output is written into the FIFO 205. The FIFO may incorporate upsample functionality on writing by writing the data in four locations in the FIFO to upsample by four. Alternatively, the upsample functionality may be incorporated into the FIFO read function by reading the same location four times. In the particular embodiment illustrated, the low pass filter output is up-sampled by four to form a block of four values for every output of the low pass filter. Thus, FIG. 5 shows the four up-sampled blocks as a0,a0,a0,a0,a1,a1,a1,a1,a2,a2,a2,a2, a3,a3,a3,a3 for the four low pass filter outputs a0,a1,a2,a3. The up-sampled blocks then go to dithering block 501. The dithering block replaces two terms of an upsampled block with two terms of an adjacent later in time upsampled block. Thus, as shown in FIG. 5, the dithered up-sampled output is a1,a1,a0,a0,a2,a2,a1,a1, a3,a3,a2,a2. Half of each upsampled block is replaced with two up-sampled output values from an adjacent block. Thus, a1,a1 replace a0,a0; a2,a2, replace a1,a1; and a3,a3, replace a2,a2.

Figure 6:
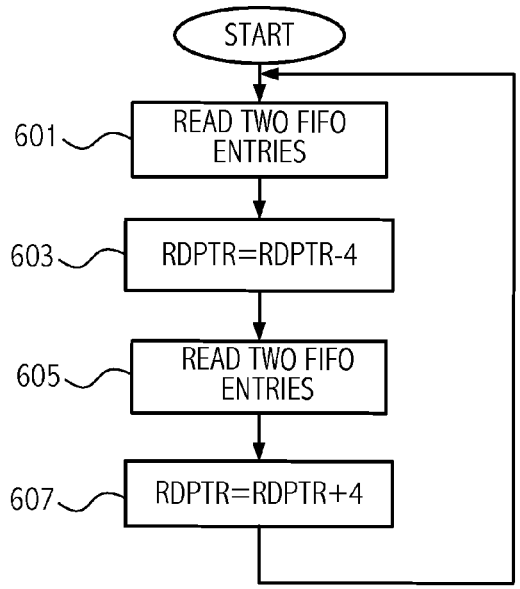
FIG. 6 illustrates an implementation of digital dithering according to an embodiment of the invention.

While a separate dithering block 501 is shown, embodiments may combine the read from the FIFO with the dithering so that the appropriate dithered FIFO values are read from the FIFO to control the selector circuit 207. Read circuits to accomplish such dithering can be implemented, in one embodiment, in accordance with FIG. 6. In FIG. 6, the upsampled blocks are assumed to be stored in the FIFO. At 601, the read pointer reads two FIFO values, e.g., a1,a1, then, in 603, four is subtracted from the read pointer, and in 605 two more FIFO values are read, e.g., a0,a0. Then the read pointer advances four in 607 and the process returns to 601 where two values are read, e.g., a2,a2.

Figure 7:
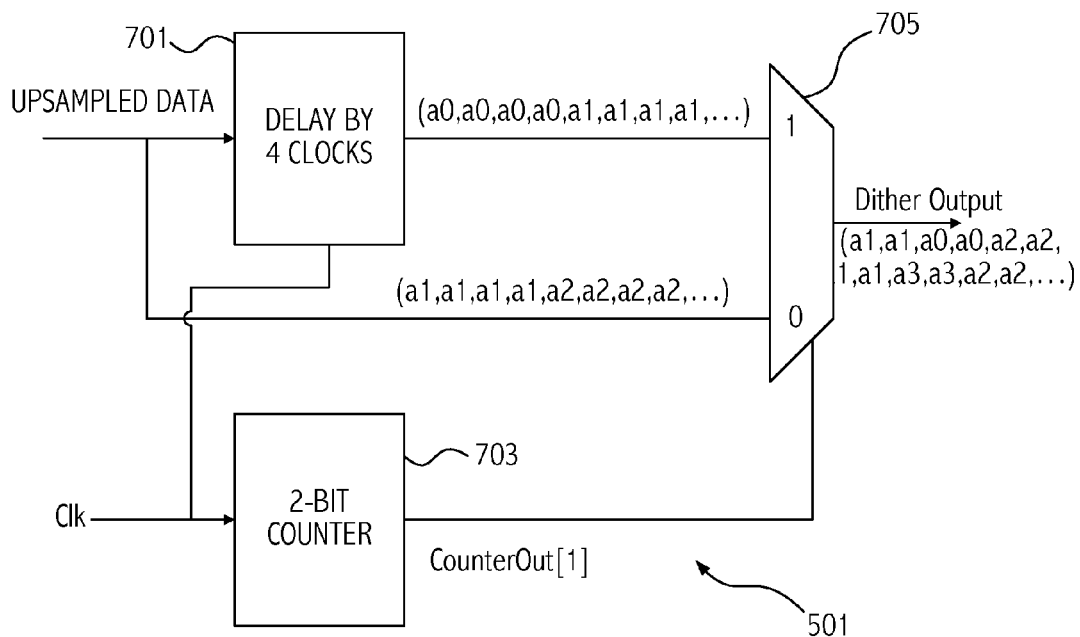
FIG. 7 illustrates an implementation of a digital dithering circuit according to another embodiment of the invention.

The dithering functionality can be implemented, in another embodiment, in accordance with the dithering circuit shown in FIG. 7. A delay block 701, delays the FIFO output stream by four clock cycles. A two-bit counter 703 selects the appropriate bits of the delayed or non-delayed stream in multiplexer 705 to generate the desired dithering pattern shown. The dithering technique described herein has the advantage of being low power, simple to implement, and effective in reducing spurs.

Figure 8:
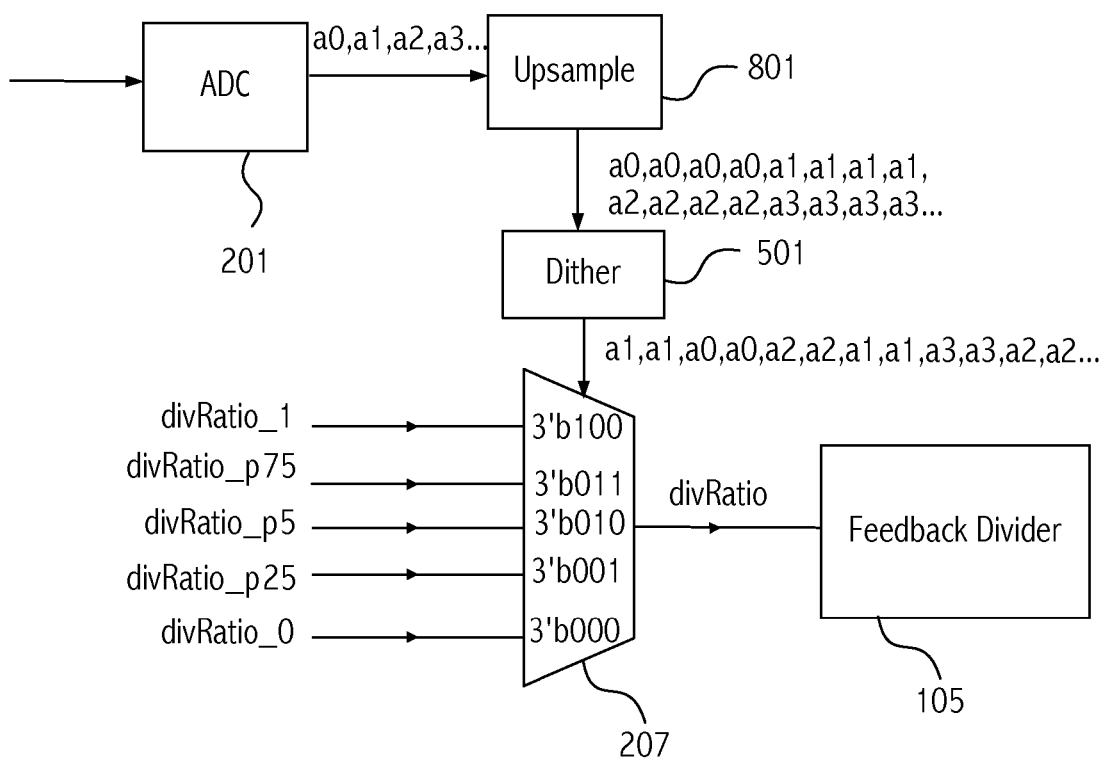
FIG. 8 illustrates another embodiment of the invention in which the output of the ADC is upsampled and dithered without the use of a low pass filter.

While the examples shown in FIG. 5 use data upsampled from the low pass filter, in other embodiments, the ADC data may be upsampled directly. Thus, as shown in FIG. 8, data from ADC 201 is upsampled in upsample block 801 and supplied to the dither circuit 501. In addition, while the data was upsampled to four to one in the embodiment shown in FIGS. 5 and 8, other embodiments may use other upsampling rates, e.g., six to one or eight to one. In such embodiments, the dithering occurs by replacing half of each upsampled block with half of an adjacent upsampled block. That is a three-bit block is replaced by a later in time but adjacent three-bit block if the upsampling is six to one and a four-bit block is replaced by a later in time adjacent four-bit block if upsampled by eight to one. While half the block may be replaced by replacing every other entry in the block (a1,a0,a1,a0), preferred embodiments replace sequential portions of the block (a1,a1, a0,a0).

The description of the invention set forth herein is illustrative, and is not intended to limit the scope of the invention as set forth in the following claims. Other variations and modifications of the embodiments disclosed herein may be made based on the description set forth herein, without departing from the scope and spirit of the invention as set forth in the following claims.

What is claimed is:

1. A method of controlling a frequency of an oscillator output signal comprising:
   receiving a voltage control signal at a voltage control signal input terminal;
   converting a voltage level of the voltage control signal in a one-bit analog-to-digital converter (ADC) to a digital output indicative of the voltage level;
   upsampling successive digital representations of the voltage level, the digital representations corresponding to the digital output of the ADC, to generate upsampled blocks of the successive digital representations of the voltage level, each block corresponding to a particular digital representation of the voltage level of the voltage control signal;
   inserting a digital dither in the upsampled blocks corresponding to the voltage control signal to generate dithered upsampled data; and
   using the dithered upsampled data to generate a divide ratio for a feedback divider of a phase-locked loop circuit to thereby control the frequency of the oscillator output signal.

2. The method as recited in claim 1 further comprising:
   low pass filtering the digital output from the ADC indicative of the voltage level of the voltage control signal to generate in the low pass filter the successive digital representations of the voltage level.

3. The method as recited in claim 1 further comprising supplying the successive digital representations of the voltage level from the low pass filter to a first in first out buffer.

4. The method as recited in claim 1 wherein the digital output from the ADC is the successive digital representations of the voltage level that are upsampled.

5. The method as recited in claim 1 wherein inserting the digital dither comprises replacing half of a block of upsampled data by half of a block of adjacent later in time upsampled data.

6. The method as recited in claim 2 wherein the upsampling rate is four to one.

7. The method as recited in claim 1 further comprising:
   supplying a selector circuit with predetermined divide ratios for the feedback divider;
   selecting one of the predetermined divide ratios in the selector circuit according to the dithered upsampled data; and
   supplying the selected one of the predetermined divide ratios to the feedback divider.

8. The method as recited in claim 1 wherein inserting the digital dither comprises:
   supplying the upsampled data to a delay circuit and to a selector circuit; and
   selecting one of delayed upsampled data and the upsampled data according to an output of a counter.

9. An apparatus comprising:
   a voltage control signal input terminal to receive a voltage control signal indicative of a desired frequency of an output signal of an oscillator;
   a one-bit analog-to-digital converter (ADC) coupled to the voltage control signal input terminal to generate digital signals having a ones density indicative of a voltage level of the voltage control signal;
   an upsampling circuit coupled to the ADC to upsample digital representations of the voltage level and configured to generate upsampled blocks of data, each of the upsampled blocks corresponding to a digital representation of the voltage level of the voltage control signal; and
   a dithering circuit to insert a digital dither in the upsampled blocks of data to generate dithered upsampled blocks of data.

10. The apparatus as recited in claim 9 further comprising:
    a phase-locked loop circuit including a feedback divider and wherein values of the dithered upsampled blocks of data are used to determine a divide ratio for the feedback divider circuit.

11. The apparatus as recited in claim 9 further comprising:
    a low pass filter coupled between the ADC and the dithering circuit, the low pass filter coupled to receive the digital output from the ADC and configured to generate the digital representations of the voltage control signal.

12. The apparatus as recited in claim 11 wherein the low pass filter is configured to generate a value corresponding to a number of ones in a predetermined number of ADC output bits.

13. The apparatus as recited in claim 9 wherein the digital output from the ADC is the digital representations that are upsampled.

14. The apparatus as recited in claim 9 wherein the dithering circuit is operable to replace half of a block of upsampled data by half of a block of adjacent later in time upsampled data.

15. The apparatus as recited in claim 13 wherein the dithering circuit is operable to replace a first half of the block of upsampled data by the half of the block of adjacent later in time upsampled data.

16. The apparatus as recited in claim 9 wherein the upsampling rate is four to one.

17. The apparatus as recited in claim 10 further comprising:
    a selector circuit coupled to receive predetermined divide ratios for the feedback divider corresponding to predetermined values of the voltage control signal;
    wherein the selector circuit is coupled to supply one of the predetermined divide ratios to the feedback divider according to the dithered upsampled data.

18. The apparatus as recited in claim 17 further comprising:
    a low pass filter coupled between the ADC and the dithering circuit, the low pass filter coupled to receive the digital output from the ADC and configured to generate the digital representations of the voltage level, each possible filter output corresponding respectively to one of the predetermined divide ratios.

19. The apparatus as recited in claim 18 further comprising a first in first out buffer coupled between the low pass filter and the selector circuit.

20. The apparatus as recited in claim 9 wherein the dithering circuit comprises:
    a delay circuit coupled to receive the upsampled blocks of data;
    a dither selector circuit coupled to the delay circuit and the upsampled blocks of data and to a selector circuit; and
    a counter circuit coupled to control the selector circuit to select one of the delayed upsampled data and the upsampled data according to an output of a counter.

* * * * *